United States Patent
Kuboi

(10) Patent No.: US 7,222,773 B2
(45) Date of Patent: May 29, 2007

(54) SEMICONDUCTOR BONDING APPARATUS

(75) Inventor: Toru Kuboi, Akishima (JP)

(73) Assignee: Olympus Corporation, Tokyo (JP)

( * ) Notice: Subject to any disclaimer, the term of this patent is extended or adjusted under 35 U.S.C. 154(b) by 266 days.

(21) Appl. No.: 10/828,414

(22) Filed: Apr. 20, 2004

(65) Prior Publication Data

US 2004/0226980 A1 Nov. 18, 2004

(30) Foreign Application Priority Data

May 13, 2003 (JP) .............................. 2003-134331

(51) Int. Cl.
*B23K 1/00* (2006.01)
*B23K 5/00* (2006.01)
*B23K 37/04* (2006.01)

(52) U.S. Cl. ...................... 228/6.2; 228/49.5

(58) Field of Classification Search ...................... None
See application file for complete search history.

(56) References Cited

U.S. PATENT DOCUMENTS

| | | | | |
|---|---|---|---|---|
| 3,790,738 A | * | 2/1974 | Laub et al. | 219/85.14 |
| 4,611,397 A | * | 9/1986 | Janisiewicz et al. | 29/834 |
| 4,614,292 A | * | 9/1986 | Polansky et al. | 228/1.1 |
| 4,676,649 A | * | 6/1987 | Phillips | 356/401 |
| 4,876,791 A | * | 10/1989 | Michaud et al. | 29/840 |
| 5,317,221 A | * | 5/1994 | Kubo et al. | 310/12 |
| 5,351,872 A | * | 10/1994 | Kobayashi | 228/6.2 |
| 5,368,217 A | * | 11/1994 | Simmons et al. | 228/6.2 |
| 5,667,129 A | * | 9/1997 | Morita et al. | 228/102 |
| 6,585,462 B1 | * | 7/2003 | Goransson | 409/231 |
| 6,616,031 B2 | * | 9/2003 | Wong et al. | 228/102 |

FOREIGN PATENT DOCUMENTS

JP 2002-134563 5/2002

* cited by examiner

*Primary Examiner*—Lynne R. Edmondson
(74) *Attorney, Agent, or Firm*—Scully, Scott, Murphy & Presser, P.C.

(57) ABSTRACT

There is disclosed a semiconductor bonding apparatus which mounts a semiconductor chip via an elastic member disposed between the semiconductor chip and a mounting substrate, comprising a holding section which holds the semiconductor chip facing the mounting substrate, a translatory gas bearing which is connected to the holding section and which is capable of moving the semiconductor chip in a bonding direction with respect to the mounting substrate, a voice coil motor connected to the translatory gas bearing, a load cell which detects a pressing force to be applied to the elastic member by the holding section, and a driving section which generates a driving signal in accordance with the pressing force detected by the load cell to drive the voice coil motor.

7 Claims, 4 Drawing Sheets

SEMICONDUCTOR BONDING APPARATUS

CROSS-REFERENCE TO RELATED APPLICATIONS

This application is based upon and claims the benefit of priority from prior Japanese Patent Application No. 2003-134331, filed May 13, 2003, the entire contents of which are incorporated herein by reference.

BACKGROUND OF THE INVENTION

1. Field of the Invention

The present invention relates to a semiconductor bonding apparatus, particularly to a semiconductor bonding apparatus which bonds a semiconductor chip via an elastic member disposed between a semiconductor chip and a mounting substrate.

2. Description of the Related Art

In recent years, optical members such as a lens and mirror have been added to a semiconductor chip or a mounting substrate to be mounted on optical products such as an optical communication apparatus and a microscope, and an optical device has been well developed aiming at reduction of the number of components for use in the whole device, miniaturization of the product, and enhancement of a function. In many of these optical devices, the semiconductor chip has to be bonded to the mounting substrate at an interval which is kept as a predetermined distance in order to effectively fulfill an optical function. There has been a demand for higher precision in the interval to be kept as compared with conventional bonding of the semiconductor chip to the mounting substrate.

For the conventional bonding of the semiconductor chip to the mounting substrate, there is a major demand that a mechanical bonding strength be secured and an electric conduction be obtained. There is little demand that the interval between the semiconductor chip and the mounting substrate be secured at high precision. Therefore, also for the bonding of these devices, a bonding apparatus is hardly seen including a function of controlling a height position of the semiconductor chip or the mounting substrate at a bonding time as a factor which determines the interval between the semiconductor chip and the mounting substrate with the high precision.

As the bonding apparatus which controls the height position of the semiconductor chip, there is a semiconductor manufacturing apparatus described in Jpn. Pat. Appln. KOKAI Publication No. 2002-134563. The semiconductor manufacturing apparatus of the Jpn. Pat. Appln. KOKAI Publication No. 2002-134563 will be described with reference to FIG. 8.

That is, a linear motor 106 which is movable in a vertical direction in accordance with control of a controller 108 is installed in the semiconductor manufacturing apparatus. The linear motor 106 is connected to a mounted nozzle 105 which is capable of holding a semiconductor device 101. Moreover, a position sensor 107 capable of detecting the height of the mounted nozzle 105 is disposed in the vicinity of the mounted nozzle 105. It is possible to position a mounting substrate 102 by a positioning stage 104 on which the mounting substrate 102 is disposed.

In the constitution, first, the mounting substrate 102 is positioned in a horizontal direction by use of the positioning stage 104. Moreover, the controller 108 drives the linear motor 106 to start lowering the mounted nozzle 105 in a state in which the semiconductor device 101 is adsorbed/held by the mounted nozzle 105. Subsequently, the height of the mounted nozzle 105 at this time is measured by the position sensor 107, and the position of the mounted nozzle 105 is controlled to bring soldering bumps of the semiconductor device 101 into contact with the mounting substrate 102.

When the semiconductor device 101 contacts the mounting substrate 102 in this manner, the semiconductor device 101 and mounting substrate 102 are heated by a heater table 103. When the soldering bumps of a bonded portion are molten and liquefied, the soldering bumps are pressed/crushed by a defined amount, and the semiconductor device 101 is positioned in a height direction with respect to the mounting substrate 102. Thereafter, the mounted nozzle 105 is lifted up as if the soldering bumps were stretched.

It is to be noted that in a method of the Jpn. Pat. Appln. KOKAI Publication No. 2002-134563, an upper limit is set on a driving current value to be passed through the linear motor 106 in order to prevent the linear motor 106 from being driven at a certain thrust or more, when moving downwards the mounted nozzle 105.

Separately from the method of the Jpn. Pat. Appln. KOKAI Publication No. 2002-134563, there is a bonding method in which the semiconductor chip is bonded to the mounting substrate via an elastic member disposed between the semiconductor chip and the mounting substrate in order to secure the interval between the semiconductor chip and the mounting substrate at the height position. In the bonding method, the semiconductor chip or the mounting substrate is pressed to deform the elastic member disposed between the semiconductor chip and the mounting substrate, and a pressing force at this time is controlled. Accordingly, deformation of the elastic member is controlled to determine the interval between the semiconductor chip and the mounting substrate.

BRIEF SUMMARY OF THE INVENTION

According to a first mode of the present invention, there is provided a semiconductor bonding apparatus which mounts a semiconductor chip via an elastic member disposed between the semiconductor chip and a mounting substrate, comprising:

a holding section which holds the semiconductor chip facing the mounting substrate;

a translatory gas bearing which is connected to the holding section and which is capable of moving the semiconductor chip in a bonding direction with respect to the mounting substrate;

a voice coil motor connected to the translatory gas bearing;

at least one load cell which detects a pressing force to be added to the elastic member by the holding section, when the semiconductor chip is mounted; and a driving section which generates a driving signal in accordance with the pressing force detected by the load cell to drive the voice coil motor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described hereinafter with reference to the drawings.

First Embodiment

Figure 1:
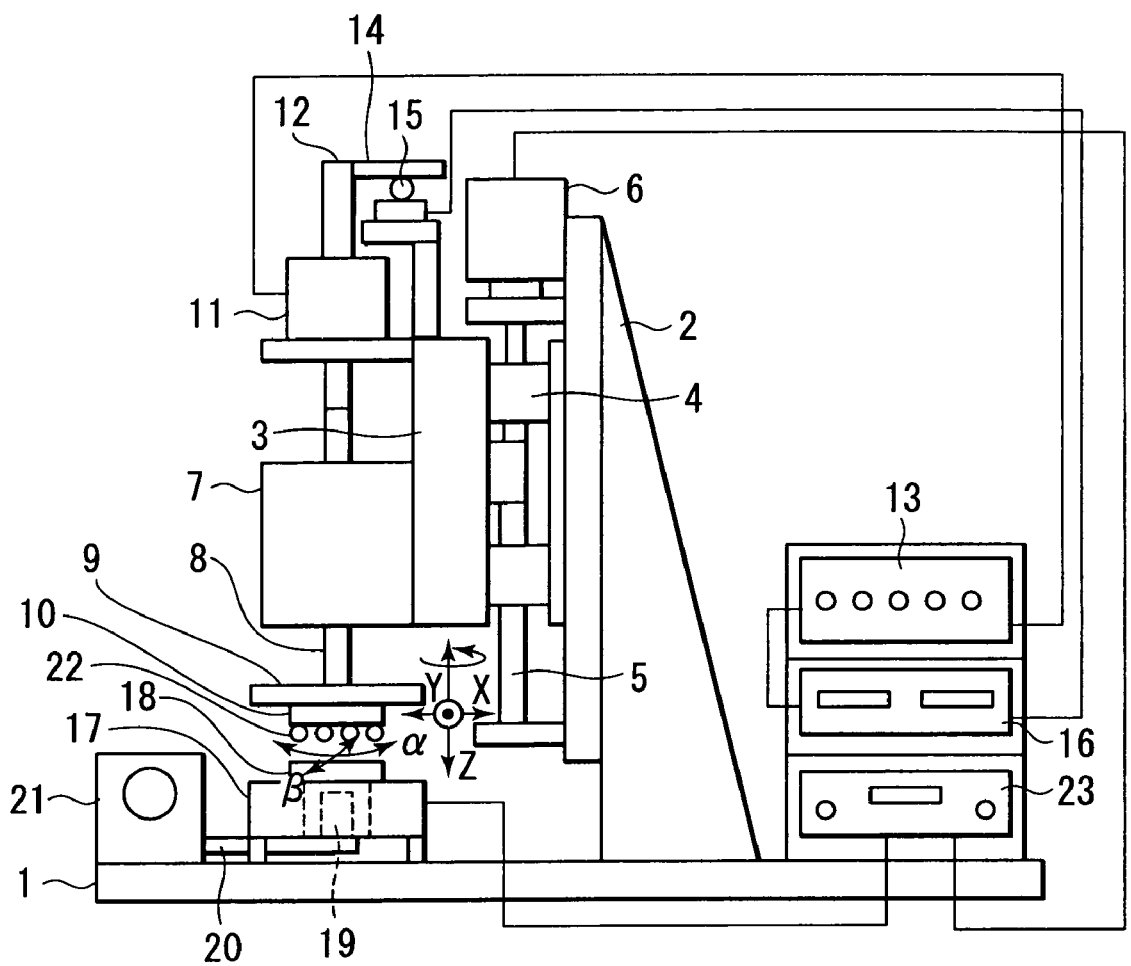
FIG. 1 is an appearance front view showing a constitution of a semiconductor bonding apparatus according to a first embodiment of the present invention.

A semiconductor bonding apparatus according to a first embodiment of the present invention will be described with reference to FIG. 1. FIG. 1 is a constitution diagram of the semiconductor bonding apparatus according to the first embodiment.

An angle plate 2 is disposed on a base 1, and a Z-stage 3 movable in a Z-direction (vertical direction in the drawing) is disposed on the angle plate 2. A guide 4 is attached to the Z-stage 3, and this guide 4 is attached to a Z-stage motor 6 via a ball screw 5. Furthermore, the Z-stage motor 6 is connected to a driver controller (hereinafter referred to as the controller) 23, and it is possible to rotate the Z-stage motor 6 at an optional speed by the controller 23. Here, examples of the Z-stage motor 6 include a pulse motor, servo motor, ultrasonic motor and the like. The Z-stage 3 may also be driven by a linear motor. In this case, the Z-stage motor 6 or the ball screw 5 is not required.

That is, when the Z-stage motor 6 is driven by the controller 23, a rotary movement of the motor is converted to a linear movement in a bonding direction of a semiconductor chip 10 to a mounting substrate 18 via the ball screw 5, that is, in a Z-direction of FIG. 1. Furthermore, the guide 4 linearly moves in the Z-direction by the linear movement of the ball screw 5, and the Z-stage 3 is guided to also linearly moves in the Z-direction. Accordingly, it is possible to move the Z-stage 3 to an optional position at an optional speed. It is to be noted that the guide 4 may include rolling guide mechanisms such as a cross roller and ball guide, or sliding mechanisms such as a dovetail groove. The ball screw 5 may be another type of feed screw represented by a trapezoidal screw, and the screw is not limited to the ball screw.

A translatory gas bearing 7 is disposed on the Z-stage 3. For the translatory gas bearing 7, a gas pressure of a gap between the translatory gas bearing 7 and a shaft 8 is kept to be high by the use of viscosity of a gas, and accordingly the shaft 8 is movable in a floating state from the wall surface of the translatory gas bearing 7. The translatory gas bearing 7 is disposed in such a manner that a movement axis of the shaft 8 which is a bearing object component is parallel to that of the Z-stage 3, and is movable in the Z-direction separately from the movement of the Z-stage 3.

A holding section 9 is disposed on a lower end of the shaft 8, and it is possible to hold the semiconductor chip 10 by the holding section 9, for example, by vacuum adsorption. It is to be noted that a method of holding the semiconductor chip 10 may be any of methods such as grasping, electrostatic adsorption, adhesion, surface tensile force, and laser trap, and the method is not limited to vacuum adsorption.

On the other hand, an upper end of the shaft 8 is connected to an output shaft 12 of a voice coil motor (VCM) 11. The VCM 11 is electrically connected to a driving section 13. On receiving a driving signal produced by the driving section 13, the VCM 11 moves the shaft 8 in the Z-direction. The driving signal of the VCM 11 is changeable to an optional value and an optional polarity by setting by the driving section 13.

A sensor plate 14 is attached to the upper end of the output shaft 12 of the VCM 11, and further a load cell 15 is disposed under the sensor plate 14. The load cell 15 is a device which produces a voltage as an output signal in accordance with a pressing force. That is, when the VCM 11 is driven to move the shaft 8, the sensor plate 14 also moves, and the pressing force applied onto the load cell 15 changes. Accordingly, since the output signal of the load cell 15 changes, the pressing force applied by the VCM 11 can be detected. The load cell 15 is electrically connected to a display unit 16 which is capable of display the force applied to the load cell 15.

A stage 17 is disposed on the base 1, and the stage 17 is electrically connected to the controller 23. The stage 17 is movable in each of a horizontal direction (XY direction in the drawing), a rotation direction around a Z-axis, and an inclination direction (αβ-direction in the drawing), and it is accordingly possible to position the mounting substrate 18. The stage 17 is capable of holding the mounting substrate 18, for example, by the adsorption. Accordingly, the mounting substrate 18 is disposed so as to face the semiconductor chip 10. A predetermined number of deformable elastic members 22 are arranged in predetermined positions on the semiconductor chip 10 in order to set an interval (hereinafter referred to as the substrate interval) between the semiconductor chip 10 and the mounting substrate 18 to a value desired by an operator. It is to be noted that the elastic members 22 may also be disposed on a mounting substrate 18 side beforehand, or the elastic members 22 may also be supplied after holding the semiconductor chip 10 or the mounting substrate 18.

Moreover, a middle part of the stage 17 includes a hollow structure, and a condensing lens 19 is disposed in a lower part of the stage 17 in such a manner that the mounting substrate 18 can be irradiated with light on a lower side. The condensing lens 19 is connected to an optical fiber guide 20. Another end of the optical fiber guide 20 is connected to a UV light source 21. The UV light source 21 is a light source for hardening an adhesive material of an ultraviolet hardening type. Therefore, the mounting substrate 18 is preferably formed of materials high in ultraviolet transmissivity, such as quartz glass.

Figures 2, 5:
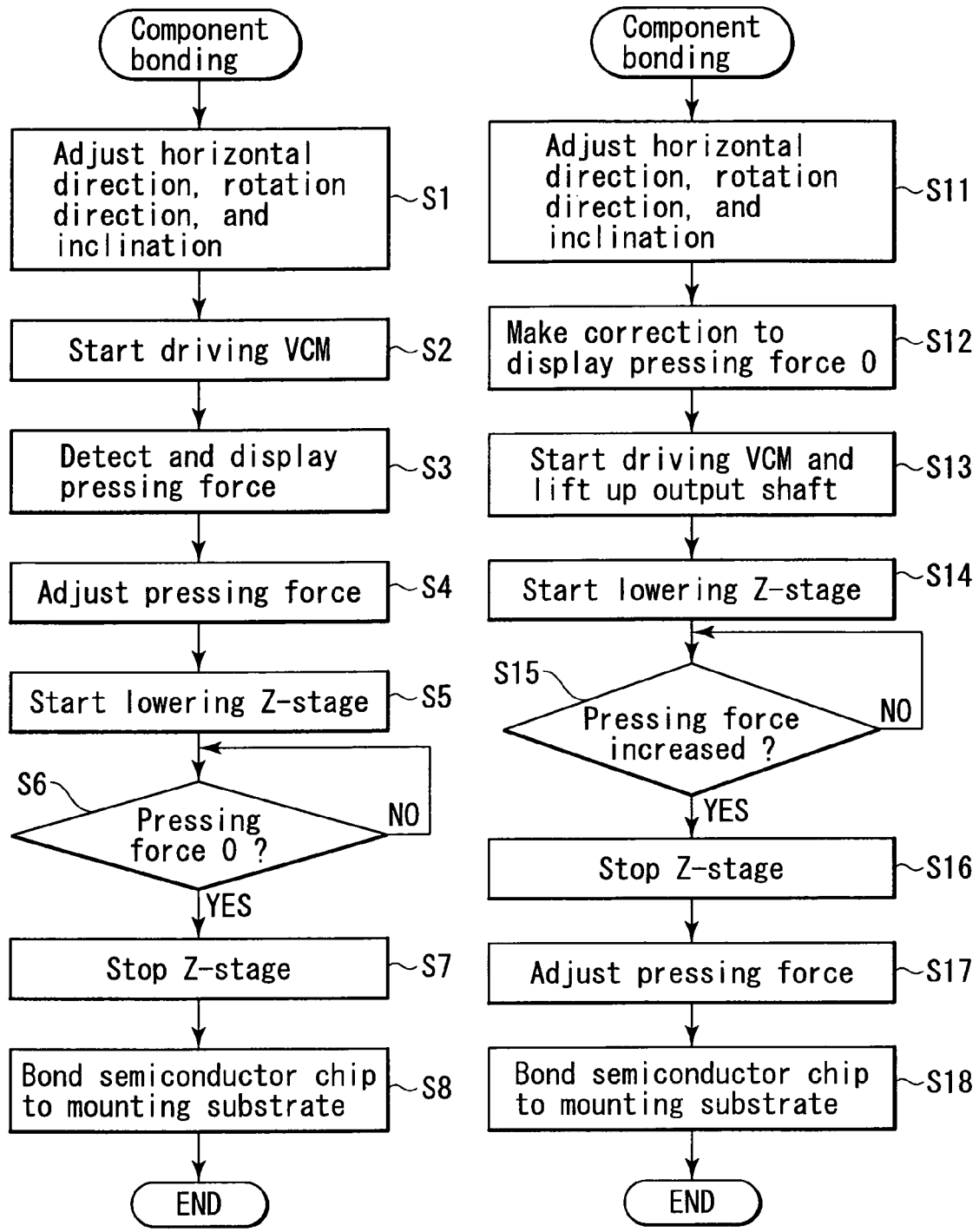
FIG. 2 is a flowchart showing a bonding procedure of the semiconductor bonding apparatus according to the first embodiment of the present invention.
FIG. 5 is a flowchart showing a bonding procedure of the semiconductor bonding apparatus according to the second embodiment of the present invention.

Next, a procedure at a component bonding time in the first embodiment will be described with reference to FIG. 2. The semiconductor chip 10 is adsorbed/held onto the holding section 9. Next, the mounting substrate 18 is disposed and adsorbed/held onto the stage 17. In this state, an operation of the present semiconductor bonding apparatus is started.

The controller 23 of the semiconductor bonding apparatus first moves the stage 17 to adjust the horizontal direction, rotation direction, and inclined direction of the mounting substrate 18 in such a manner that the mounting substrate 18 is brought into a predetermined position with respect to the semiconductor chip 10 (step S1). It is to be noted that in this positioning, for example, the stage 17 may be moved so as to match a marker disposed on the stage 17 with that on the holding section 9. The stage 17 does not have to be necessarily an automatic stage, and may also be a manually operated stage.

After the adjustment in this step S1, the operator operates the driving section 13, applies a driving signal to the VCM 11, and produces a thrust in the VCM 11 (step S2). This thrust is transmitted to the load cell 15 via the sensor plate 14. The display unit 16 displays the pressing force detected by the load cell 15 (step S3). It is to be noted that the pressing force actually displayed at this time includes the thrust generated by the VCM 11, and is additionally influenced by weights of constituting components connected to the sensor plate 14 such as the holding section 9, semiconductor chip 10, and VCM 11. While checking the pressing force displayed on the display unit 16, the operator adjusts the value of a current signal of the driving section 13 and selects polarity of the current signal to set the pressing force to a desired value. The driving section 13 receives this setting and adjusts the thrust of the VCM 11 to adjust the pressing force (step S4). Thereafter, the thrust of the VCM 11 is not changed. It is to be noted that the adjustment of the pressing force in the step S4 is manually performed by the operator. Additionally, the set value of the pressing force may also be input beforehand, and the driving section 13 may accordingly adjust the pressing force. It is to be noted that the set value indicates a pressing force by which the elastic members 22 are deformed by predetermined amounts. It is assumed that the pressing force is obtained beforehand by experiment or calculation.

Figure 3:
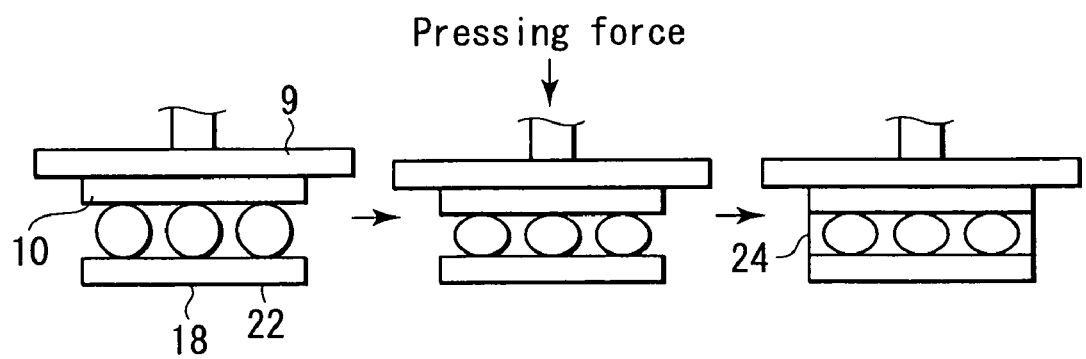
FIG. 3 is a diagram showing deformation of an elastic member at a component bonding time.

After the adjustment of the pressing force, in response to the manual operation by the operator, the controller 23 drives the Z-stage motor 6 to move down the Z-stage 3 toward the mounting substrate 18 (step S5). When the Z-stage 3 moves down, the semiconductor chip 10 contacts the elastic members 22. When the Z-stage 3 is further moved downwards in this state, the sensor plate 14 is detached from the load cell 15, and the pressing force applied to the load cell 15 is applied to the elastic members 22. Here, the translatory gas bearing 7 includes a mechanism which keeps the gas pressure of the gap between the translatory gas bearing 7 and the shaft 8 to be high by the use of the viscosity of the gas, so that the shaft 8 is moved in a floated state from the wall surface of the translatory gas bearing 7. Therefore, a sliding resistance generated between the translatory gas bearing 7 and the shaft 8, and a fluctuation of the resistance are remarkably small at an ignorable degree. Therefore, the pressing force which has been applied to the load cell 15 is exactly applied to the elastic members 22 in any position regardless of the position of the Z-stage 3, in other words, a relative position between the translatory gas bearing 7 and the shaft 8. At this time, the elastic members 22 are crushed and deformed by the predetermined amounts by the pressing force applied from the semiconductor chip 10 as shown in FIG. 3.

At this time, the driving section 13 judges whether or not the sensor plate 14 is detached from the load cell 15, that is, whether or not the pressing force detected by the load cell 15 is zero (step S6), and the lowering Z-stage 3 is stopped at a time when the pressing force detected by the load cell 15 turns to zero (step S7). Moreover, the Z-stage 3 may also be manually stopped while checking the value displayed on the display unit 16. Furthermore, the lowered position of the Z-stage 3 in which the elastic members 22 are deformed by the predetermined amounts may also be obtained beforehand by the experiment or the like, so that the Z-stage 3 is stopped in accordance with the lowered position.

After stopping the Z-stage 3, the semiconductor chip 10 is bonded to the mounting substrate 18 (step S8). That is, an adhesive 24 of the ultraviolet hardening type is charged between the semiconductor chip 10 and the mounting substrate 18 by a dispenser (not shown) in a state in which the elastic members 22 is deformed. Moreover, an ultraviolet ray is produced by the UV light source 21, and guided into the stage 17 via the optical fiber guide 20. The ultraviolet ray is bound in a predetermined spot diameter by the condensing lens 19 disposed on the tip of the optical fiber guide 20 to irradiate the underside of the mounting substrate 18. Since the ultraviolet ray is capable of passing through the mounting substrate 18, the adhesive 24 of an ultraviolet ray hardening type hardens by the ultraviolet ray, and the semiconductor chip 10 is bonded to the mounting substrate 18 at a desired substrate interval. It is to be noted that the semiconductor chip 10 or the mounting substrate 18 may also be coated with the adhesive 24 beforehand. The condensing lens 19 does not have to be necessarily disposed in accordance with a required work distance or irradiation intensity.

As described above, in the first embodiment, while checking the pressing force actually generated by the load cell 15, the driving signal of the VCM 11 can be set. Therefore, it is possible to exactly set the pressing force. It is therefore possible to exactly deform the elastic members 22. As a result, it is possible to exactly set the substrate interval between the semiconductor chip 10 and the mounting substrate 18 to a desired value.

It is to be noted that a bonding member which bonds the semiconductor chip 10 to the mounting substrate 18 is not limited to the ultraviolet ray hardening adhesive 24, and a thermosetting adhesive may also be used. Alternatively, metal bumps such as soldering bumps and gold bumps may also be disposed. In this case, it is necessary to dispose a heater capable of heating at least one of the semiconductor chip 10 and the mounting substrate 18 at a required temperature on the holding section 9 or the stage 17 beforehand. When the thermosetting adhesive or the like is used in this manner, it is not necessary to select the material of the mounting substrate 18 in consideration of ultraviolet ray transmissivity, and the condensing lens 19, optical fiber guide 20, or UV light source 21 is not required.

Second Embodiment

A second embodiment of the present invention will be described with reference to FIG. 4. The second embodiment is different from the first embodiment in the arrangement of the load cell. A constitution similar to that of FIG. 1 is denoted with the same reference numerals, description thereof is omitted, and only a part different from that of FIG. 1 will be described hereinafter.

That is, in the second embodiment, the load cell 15 is disposed on the upper end of the shaft 8 which is the bearing object component of the translatory gas bearing 7, and further the shaft 8 is connected to the output shaft 12 of the VCM 11 via springs 31. The number of springs 31 is not especially limited, but a total tensile force of the springs 31 has to be larger than a total weight of all components attached to the shaft 8 including the load cell 15.

Moreover, a stopper 32 is disposed on the upper end of the output shaft 12 in order to prevent the output shaft 12 from dropping from the VCM 11. The VCM 11 is electrically connected to the driving section 13, and the driving section 13 is electrically connected to the controller 23. That is, the controller 23 is capable of controlling the driving section 13 to optionally control the thrust of the VCM 11. The controller 23 is also connected to the display unit 16, and is capable of controlling the driving section 13 while referring to an output of the load cell 15.

Figure 4:
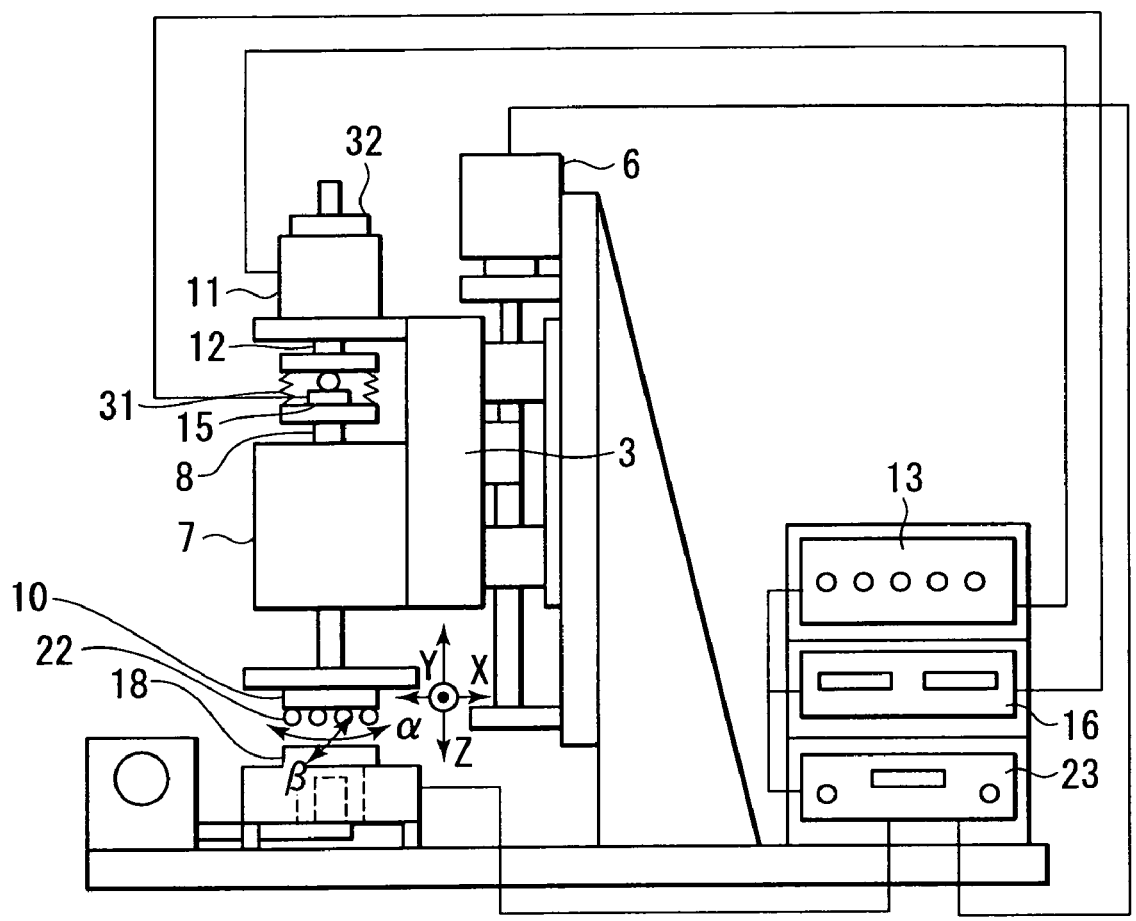
FIG. 4 is an appearance front view showing the constitution of the semiconductor bonding apparatus according to a second embodiment of the present invention.

Here, in FIG. 4, the load cell 15 is held by the shaft 8 and output shaft 12, and further undergoes a compression stress by the springs 31. Therefore, even when the pressing force is not applied to the elastic members 22, an output is constantly generated from the load cell 15 in accordance with the compression stress.

Next, a procedure at the component bonding time according to the second embodiment will be described with reference to FIG. 5. The semiconductor chip 10 is adsorbed/held onto the holding section 9. Next, the mounting substrate 18 is disposed and adsorbed/held onto the stage 17. The operation of the present semiconductor bonding apparatus is started in this state.

The controller 23 of the semiconductor bonding apparatus first moves the stage 17 to adjust the horizontal direction, rotation direction, and inclined direction of the mounting substrate 18 in such a manner that the mounting substrate 18 is brought into the predetermined position with respect to the semiconductor chip 10 (step S11). Here, as described above, the output is generated from the load cell 15 in accordance with the compression stress from the springs 31. The controller 23 makes a correction in such a manner that the pressing force displayed on the display unit 16 turns to zero in a state in which there are compression stresses from the springs 31 (step S12).

Next, the controller 23 controls the driving section 13 to drive the VCM 11, and lifts up the output shaft 12 in an upward direction of FIG. 4 (step S13). It is to be noted that the thrust to be generated in the VCM 11 has a size equal to that of a thrust generated in the Z-stage motor 6 in the step S14. Thereafter, the Z-stage motor 6 is driven, and the Z-stage 3 is lowered toward the mounting substrate 18 (step S14). Moreover, while monitoring the output of the load cell 15 by the output from the display unit 16, the controller 23 judges whether or not the output from the load cell 15 increases by a predetermined amount (step S15). When it is judged that the output from the load cell 15 increases by the predetermined amount, the lowering of the Z-stage 3 is stopped (step S16).

Here, when the Z-stage 3 moves downwards, and the elastic members 22 contact the mounting substrate 18, the mounting substrate 18 undergoes an impact load from the elastic members 22. However, since the output shaft 12 is lifted upwards by the thrust of the VCM 11, the impact load during the contact of the elastic members 22 with the mounting substrate 18 can be minimized.

After the elastic members 22 are brought into contact with the mounting substrate 18, the Z-stage 3 is further moved downwards, the stopper 32 is detached from the VCM 11, and the pressing force by the weight of the VCM 11 is applied as a part of the pressing force onto the elastic members 22 via the load cell 15. When the increase of the pressing force is detected, the controller 23 controls the driving section 13 to stop lowering the Z-stage 3. It is to be noted that the pressing force at this time is also displayed on the display unit 16.

Next, after stopping the Z-stage 3, the controller 23 moves the Z-stage 3 upwards or downwards so as to obtain the desired pressing force based on the signal detected by the load cell 15 (step S17). A control system at this time may be either open-loop control or closed-loop control. It is to be noted that the VCM 11 may also be driven instead of the Z-stage 3. Here, the pressing force is adjusted after once stopping the Z-stage 3, but the force may also be adjusted without stopping the Z-stage 3.

After adjusting the desired pressing force in the step S17, the semiconductor chip 10 is bonded to the mounting substrate 18 in the same manner as in the first embodiment (step S18).

In the second embodiment, unlike the first embodiment, the pressing force during the pressing of the elastic members 22 is actually detected by the load cell 15, and further the thrust of the VCM 11 can be controlled based on the output from the load cell 15. Therefore, it is possible to set the pressing force more exactly. Therefore, it is possible to more exactly deform the elastic members 22, and it is also possible to more exactly set the substrate interval between the semiconductor chip 10 and the mounting substrate 18.

It is to be noted that the shaft 8 and the output shaft 12 may also be guided in a thrust direction by a shaft, bush and the like. The lifting-up of the output shaft 12 in the step S13 is not necessarily required, and may be performed if necessary. For example, this can be omitted, when the pressing force is small.

Figure 6:
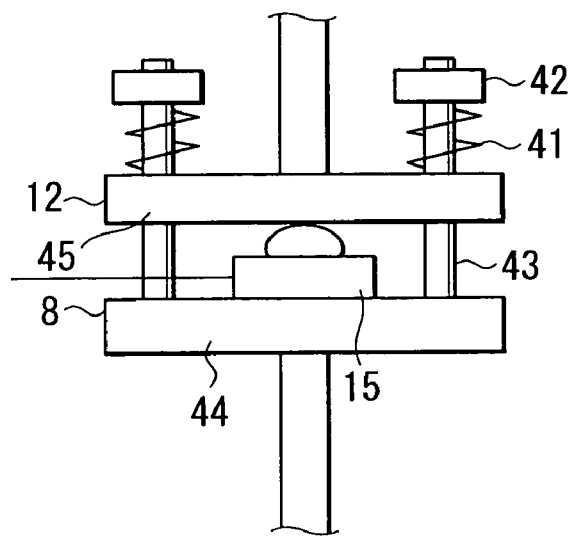
FIG. 6 is a diagram showing a modification of the second embodiment.

Next, a modification of the second embodiment will be described with reference to FIG. 6. It is to be noted that here only the part different from the second embodiment will be described. In the constitution of the semiconductor bonding apparatus in this modification, at least two spring posts 43 are disposed in the thrust direction on a flange section 44 of the shaft 8. A hole having a diameter larger than an outer diameter of the spring post 43 is made in a position for disposing the spring post 43 in a flange section 45 of the output shaft 12, and the output shaft 12 is supported by the spring posts 43 so as to be movable in the thrust direction without any load. Furthermore, compression springs 41 are disposed on the spring posts 43 so as to contact the flange section 45 of the output shaft 12. Collars 42 which are movable in the thrust direction on the spring posts 43 as axes and which can be fixed/held by the spring posts 43 are disposed on the other sides of the compression springs 41. In this structure, for example, the tip of the spring post 43 is threaded, and the collar 42 may be a nut for this thread. It is to be noted that the other constitution is similar to the second embodiment.

In this constitution, first the thrust position of the collar 42 is changed to adjust the force generated by the compression spring 41. At this time, the forces generated by the compression springs 41 are adjusted in consideration of the weights of the shaft 8 and the members connected to the shaft so as to bring the load cell 15 into press-contact with the output shaft 12. Next, the thrust position of each collar 42 is determined in such a manner that the forces generated by a plurality of compression springs 41 are prevented from deviating.

In this modification, unlike the apparatus described in the second embodiment, the generated forces of the compression springs 41 can be easily and finely adjusted. Therefore, it is possible to more exactly adjust a force for pressing the load cell 15 disposed on the shaft 8 onto the flange section 44 with good balance, and it is possible to more exactly measure the thrust generated by the VCM 11 by the load cell 15.

Figure 7:
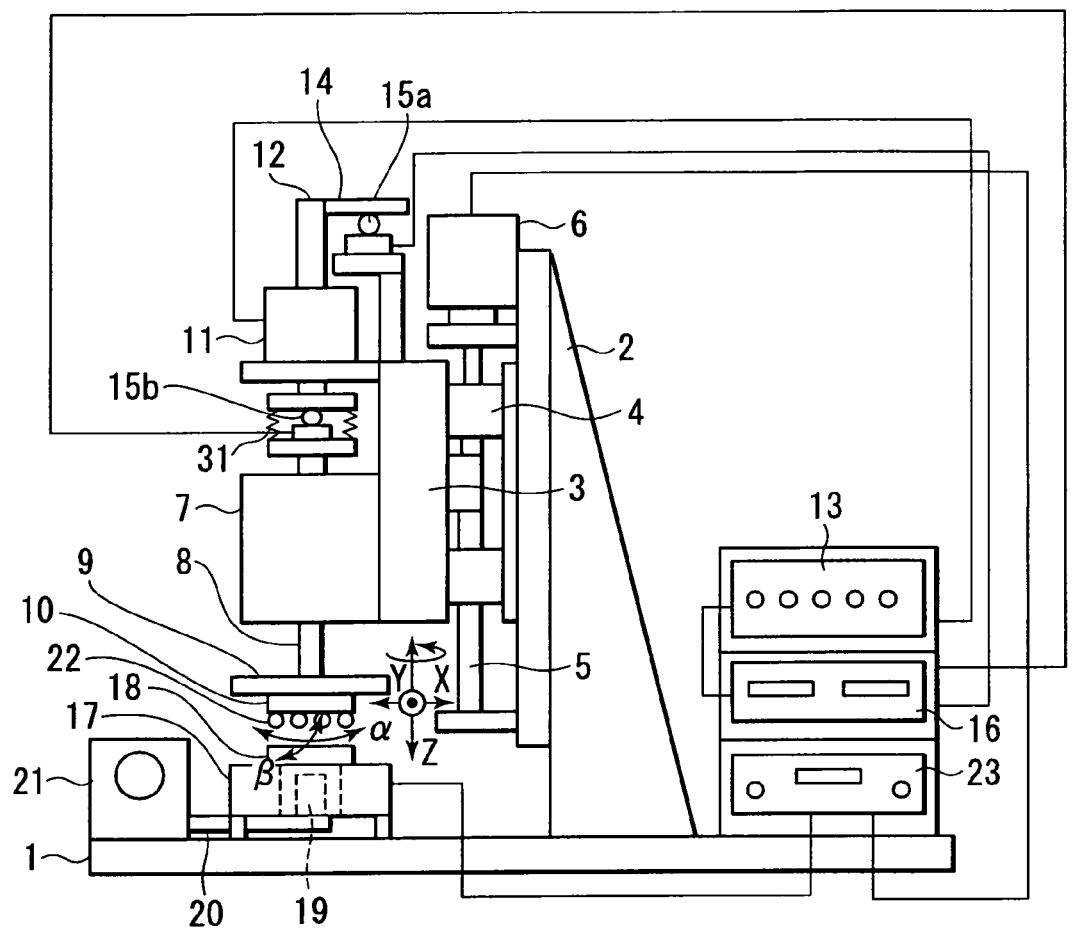
FIG. 7 is an appearance front view showing a constitution in which the first and second embodiments are combined.
Figure 8:
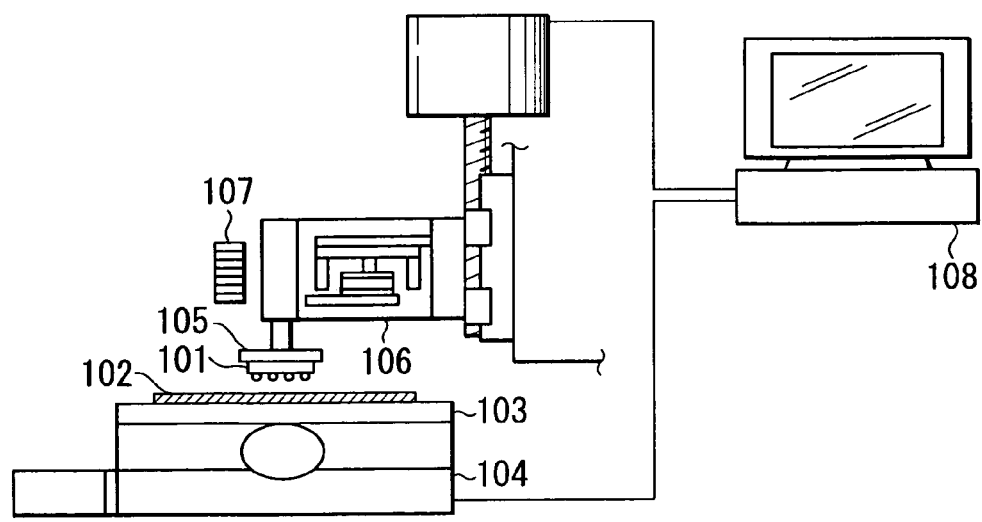
FIG. 8 is an explanatory view of a prior art.

It is to be noted that the first embodiment may be combined with the second embodiment as shown in FIG. 7.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor bonding apparatus which bonds a semiconductor chip to a mounting substrate, the semiconductor bonding apparatus comprising:
   a pressing-force adjusting section which includes (i) a holding section which holds the semiconductor chip, (ii) a translatory gas bearing which is connected to the holding section, and which is connected to the holding section, and which is capable of moving the semiconductor chip in a bonding direction with respect to the mounting substrate, and (iii) a voice coil motor connected to the translatory gas bearing, the pressing-force adjusting section generating a pressing force by using thrust generated by the voice coil motor weights of the holding section and the translatory gas bearing;
   at least one load cell which detects a pressing force generated by the pressing-force adjusting section;
   a driving section which generates a driving signal in accordance with the pressing force detected by the load cell to drive the voice coil motor; and
   a moving section which moves the pressing-force adjusting section in the bonding direction after the pressing force generated by the pressing-force adjusting section;
   wherein the moving section is controlled based on variation of the pressing force detected by the load cell, to deform an elastic member located between the semiconductor chip and the mounting substrate, whereby the semiconductor chip and the mounting substrate are bonded to each other, while being kept separated from each other by a desired distance.

2. The semiconductor bonding apparatus according to claim 1, wherein the load cell is disposed between the moving section and the voice coil motor.

3. The semiconductor bonding apparatus according to claim 2, wherein the load cell is further disposed on a shaft which is a bearing object of the translatory gas bearing.

4. The semiconductor bonding apparatus according to claim 3, further comprising:
   a display unit which displays the pressing force detected by the two load cells.

5. The semiconductor bonding apparatus according to claim 1, further comprising:
   a moving section which moves the holding section, the translatory gas bearing, and the voice coil motor,
   wherein the load cell is disposed on a shaft which is a bearing object of the translatory gas bearing.

6. The semiconductor bonding apparatus according to claim 5, further comprising:
   a display unit which displays the pressing force detected by the load cell.

7. The semiconductor bonding apparatus according to claim 1, further comprising:
   a display unit which displays the pressing force detected by the two load cell.

* * * * *